(12) United States Patent
Wang et al.

(10) Patent No.: US 10,714,448 B2
(45) Date of Patent: Jul. 14, 2020

(54) CHIP MODULE WITH POROUS BONDING LAYER AND STACKED STRUCTURE WITH POROUS BONDING LAYER

(71) Applicant: Unimicron Technology Corp., Taoyuan (TW)

(72) Inventors: Chin-Sheng Wang, Hsinchu (TW); Ra-Min Tain, Hsinchu County (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 16/203,635

(22) Filed: Nov. 29, 2018

(65) Prior Publication Data

US 2019/0096845 A1 Mar. 28, 2019

Related U.S. Application Data

(63) Continuation-in-part of application No. 15/590,020, filed on May 9, 2017, now Pat. No. 10,178,755.

(51) Int. Cl.
*H01L 23/00* (2006.01)
*H01L 23/498* (2006.01)

(52) U.S. Cl.
CPC ........ *H01L 24/73* (2013.01); *H01L 23/49822* (2013.01); *H01L 23/49866* (2013.01); *H01L 24/13* (2013.01); *H01L 24/16* (2013.01); *H01L 24/29* (2013.01); *H01L 24/32* (2013.01); *H01L 24/81* (2013.01); *H01L 2224/1357* (2013.01); *H01L 2224/13147* (2013.01); *H01L 2224/13562* (2013.01); *H01L 2224/13647* (2013.01); *H01L 2224/16227* (2013.01); *H01L 2224/16237* (2013.01); *H01L 2224/29147* (2013.01); *H01L 2224/32227* (2013.01);
(Continued)

(58) Field of Classification Search
CPC ......... H01L 23/49822; H01L 23/49866; H01L 24/13; H01L 24/16; H01L 24/29; H01L 24/32; H01L 2224/13147; H01L 2224/16227; H01L 2224/29147; H01L 2224/73104
USPC ........................................... 174/260
See application file for complete search history.

(56) References Cited

U.S. PATENT DOCUMENTS 7,183,648 B2 * 2/2007 Ramanathan ........... H01L 24/11
228/180.22
8,021,921 B2 * 9/2011 Lin ......................... H01L 24/11
438/108
(Continued)

FOREIGN PATENT DOCUMENTS

| JP | 2016029697 A | 3/2016 |
|---|---|---|
| TW | 200807661 A | 2/2008 |
| TW | I620303 B | 4/2018 |

OTHER PUBLICATIONS

Nanoparticle Assembly and Sintering Towards AllCopper Zueker et al. (Year: 2015).*
(Continued)

*Primary Examiner* — Timothy J Thompson
*Assistant Examiner* — Michael F McAllister
(74) *Attorney, Agent, or Firm* — CKC & Partners Co., LLC

(57) ABSTRACT

A chip module includes a body, a bump, and a first bonding layer. The bump is disposed on the body. The first bonding layer is disposed on the bump. The first bonding layers and the bump are made of the same conductive material and the first bonding layer is porous.

16 Claims, 27 Drawing Sheets

(52) U.S. Cl.
CPC ........... *H01L 2224/73104* (2013.01); *H01L 2224/81204* (2013.01); *H01L 2224/81447* (2013.01); *H01L 2924/351* (2013.01)

(56) References Cited

U.S. PATENT DOCUMENTS

| | | | |
|---|---|---|---|
| 8,193,624 | B1 | 6/2012 | Sohn et al. |
| 8,421,225 | B2* | 4/2013 | Ramanathan ........... H01L 24/11 |
| | | | 257/737 |
| 8,492,893 | B1 | 7/2013 | Sohn et al. |
| 8,791,562 | B2 | 7/2014 | Lee et al. |
| 9,117,825 | B2* | 8/2015 | Liu ........................ H01L 24/81 |
| 9,355,977 | B2* | 5/2016 | Lin ........................ H01L 24/06 |
| 9,462,690 | B1* | 10/2016 | Darveaux ............... H01L 24/14 |
| 9,576,929 | B1* | 2/2017 | Shao ....................... H01L 24/11 |
| 9,679,806 | B1* | 6/2017 | Arvin ..................... H01L 24/81 |
| 9,844,134 | B2* | 12/2017 | Mischitz ........... H01L 23/53228 |
| 9,875,957 | B2 | 1/2018 | Shimizu et al. |
| 9,876,042 | B2* | 1/2018 | Yoo .................. H01L 27/14614 |
| 9,899,238 | B2 | 2/2018 | Karhade et al. |
| 9,978,710 | B2* | 5/2018 | Dubey ............. H01L 23/49827 |
| 2009/0273073 | A1 | 11/2009 | Tachibana et al. |
| 2011/0198114 | A1* | 8/2011 | Maeda ............. H01L 23/49811 |
| | | | 174/257 |
| 2012/0018871 | A1 | 1/2012 | Lee et al. |
| 2012/0119359 | A1* | 5/2012 | Im ..................... H01L 23/49811 |
| | | | 257/737 |
| 2012/0186867 | A1* | 7/2012 | Asai ....................... H05K 3/387 |
| | | | 174/262 |
| 2013/0049229 | A1 | 2/2013 | Su |
| 2013/0127054 | A1 | 5/2013 | Muthukumar et al. |
| 2013/0140074 | A1* | 6/2013 | Yang ...................... H05K 1/115 |
| | | | 174/266 |
| 2014/0217062 | A1* | 8/2014 | Kunstmann ............... C23F 1/02 |
| | | | 216/41 |
| 2014/0242374 | A1* | 8/2014 | Strasser ............... C23C 18/1644 |
| | | | 428/307.7 |
| 2016/0351529 | A1* | 12/2016 | Brunschwiler ......... H01L 24/81 |
| 2017/0047302 | A1 | 2/2017 | Morita et al. |
| 2017/0194278 | A1* | 7/2017 | Shao ..................... H01L 25/50 |
| 2017/0287871 | A1 | 10/2017 | Lu |
| 2018/0082933 | A1 | 3/2018 | Ko et al. |
| 2018/0332700 | A1 | 11/2018 | Tain et al. |
| 2019/0043819 | A1 | 2/2019 | Ho et al. |
| 2019/0043847 | A1 | 2/2019 | Lee et al. |
| 2019/0189561 | A1 | 6/2019 | Rusli |

OTHER PUBLICATIONS

All-Copper Flip Chip Interconnects by Pressureless and Low Temperature Nanoparticle Jonas Zürcher et al. (Year: 2016).*
Nanoparticle Assembly and Sintering Towards AllCopper Flip Chip Interconnects Jonas Zurcher et al (Year: 2015).*

* cited by examiner

CHIP MODULE WITH POROUS BONDING LAYER AND STACKED STRUCTURE WITH POROUS BONDING LAYER

PRIORITY CLAIM AND CROSS-REFERENCE

This application is a Continuation-in-part of U.S. application Ser. No. 15/590,020, filed on May 9, 2017, the entirety of which is incorporated by reference herein.

BACKGROUND

Technical Field

The present disclosure relates to a chip module and a stacked structure including the chip module.

Description of Related Art

With the rapid growth of the electronics industry, the R & D of electronic products has gradually been directed towards the pursuit of versatility and high performance. In order to achieve the requirements of high integration and miniaturization of semiconductor components, the requirements of circuit boards must also increase. For example, the pitch of the traces of the circuit board is required to become smaller and smaller, and the circuit board is required to become thinner and thinner. When the pitch of the traces of the circuit board and the thickness of the circuit board become smaller, the yield is also more susceptible to a variety of external factors. For example, if the circuit board is put in a high temperature environment during manufacturing processes, the structure stability may be affected due to the different thermal expansion coefficients of different layers.

To further improve the circuit boards, persons in the industry have made every endeavor to discover new solutions. The application and improvement of the circuit boards has become one of the most important research topics.

SUMMARY

This disclosure provides a chip module and a stacked structure including thereof to improve the overall structure stability.

In one aspect of the disclosure, a chip module is provided. The chip module includes a body, a bump, and a first bonding layer. The bump is disposed on the body. The first bonding layer is disposed on the bump. The first bonding layers and the bump are made of the same conductive material and the first bonding layer is porous.

In one aspect of the disclosure, a stacked structure is provided. The stacked structure includes the chip module and a circuit board. The circuit board includes a circuit layer, a dielectric layer, and a patterned seed layer. The dielectric layer is disposed over the circuit layer and has an opening to expose a part of the circuit layer, in which the first bonding layer of the chip module is in the opening. The patterned seed layer is disposed between the exposed part of the circuit layer and the first bonding layer of the chip module and is disposed on a sidewall of the opening. The bump and the first bonding layer of the chip module and the circuit layer and the patterned seed layer of the circuit board are bonded with each other to form an integral solid structure.

In one or more embodiments, the first bonding layer and the bump of the chip module are made of copper.

In one or more embodiments, the bump is porous-free.

In one or more embodiments, the first bonding layer of the chip module is conformally formed on the bump.

In one or more embodiments, the first bonding layer of the chip module is in contact with the bump.

In one or more embodiments, the first bonding layer of the chip module is disposed on a top surface of the bump that is opposite to the body of the chip module.

In one or more embodiments, the first bonding layer is disposed on a side wall of the bump of the chip module.

In one or more embodiments, the first bonding layer is in contact with the body of the chip module.

In one or more embodiments, the first bonding layer and the bump of the chip module and the patterned seed layer of the circuit board are made of copper.

In one or more embodiments, the patterned seed layer of the circuit board is porous-free.

In one or more embodiments, the first bonding layer of the chip module is in contact with the patterned seed layer of the circuit board.

In one or more embodiments, the stacked structure further includes a second bonding layer between the patterned seed layer of the circuit board and the first bonding layer of the chip module, wherein the patterned seed layer of the circuit board and the second bonding layer are made of the same conductive material, and the second bonding layer is porous.

In one or more embodiments, the bump and the first bonding layer of the chip module, the circuit layer and the patterned seed layer of the circuit board, and the second bonding layer are bonded with each other to form an integral solid structure.

In one or more embodiments, the first bonding layer and the bump of the chip module, the patterned seed layer of the circuit board, and the second bonding layer are made of copper.

In one or more embodiments, the second bonding layer of the chip module is in contact with the body of the chip module.

In one or more embodiments, the sidewall of the opening is tapered upward.

In one or more embodiments, the sidewall of the opening is substantially perpendicular to a top surface of the first dielectric layer.

The bumps are bonded to the bonding layers. Because the thermal expansion coefficients of the bumps and the bonding layers are the same, the connection portions of the bumps and the bonding layers will not break due to different thermal expansions. Further, when the bumps are bonded to the bonding layers, the sharp corners of the bumps will press the inclined surface of the bonding layers, thereby generating a driving force, such that the diffusion rate of the copper atoms in the bumps and the bonding layers can be effectively enhanced.

In addition, because the bonding layers are made of porous copper, the exchange rate of the copper atoms in the bumps and the bonding layers can be further enhanced when the bumps and the bonding layers are in contact with each other. Therefore, the temperature and the pressure required to carry out the bonding process of the bumps and bonding layer can be effectively lowered. At the same time, because the stacked structure does not need to withstand higher temperature and pressure, the overall structure stability of the stacked structure can be effectively improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
FIGS. 1A to 1I are schematic cross-sectional views of intermediate operations in a method for manufacturing a circuit board according to one embodiment of this disclosure.

FIGS. 1A to 1I are schematic cross-sectional views of intermediate operations in a method for manufacturing a circuit board 100 according to one embodiment of this disclosure. A method for forming a circuit board 100 is provided. First, as shown in FIG. 1A, a carrier 101 is provided.

Figure 1B:
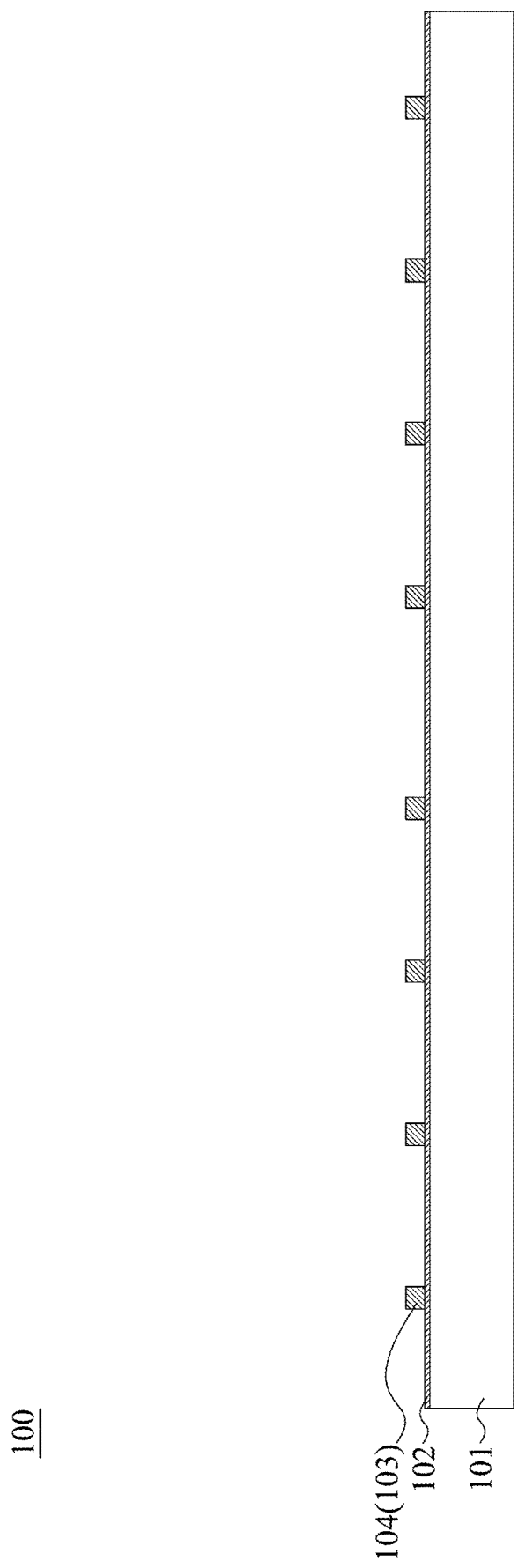

As shown in FIG. 1B, a metal bonding layer 102 is formed on the carrier 101. Then, a pad layer 103 is formed on the metal bonding layer 102. Finally, a plurality of pad 104 is formed by patterning the pad layer 103. Specifically, the metal bonding layer 102 may be made of titanium, and the pad layer 103 may be made of copper. The metal bonding layer 102 and the pad layer 103 may be formed by sputtering.

Figure 1C:
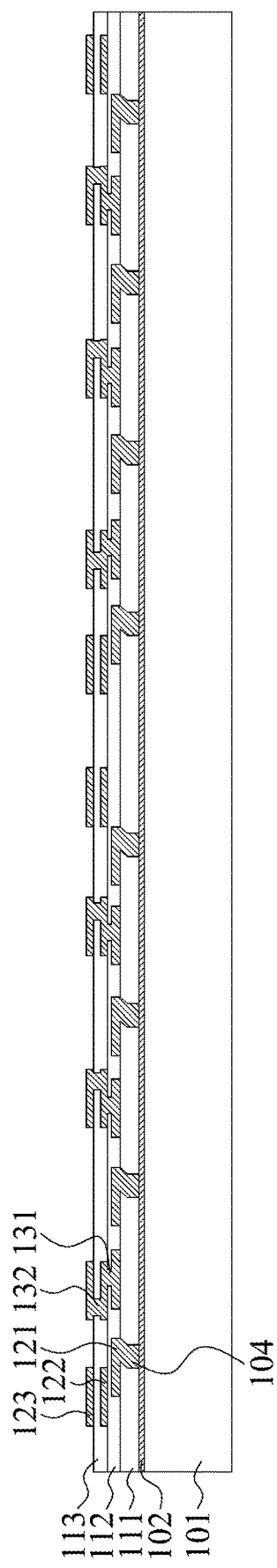

As shown in FIG. 1C, the dielectric layers 111, 112, and 113, the circuit layer 121, 122, and 123, a plurality of conductive vias 131, and a plurality of conductive vias 132 are respectively formed. The dielectric layer 111 is disposed on the metal bonding layer 102. The pad 104 is disposed in the dielectric layer 111. The circuit layer 121 is disposed on the dielectric layer 111 and in the dielectric layer 112, and the circuit layer 121 is connected to the pad 104. The dielectric layer 112 is disposed on the dielectric layer 111 and the circuit layer 121. The circuit layer 122 is disposed on the dielectric layer 112 and in the dielectric layer 113. The conductive vias 131 are disposed in the dielectric layer 112 and connect the circuit layer 121 to the circuit layer 122. The dielectric layer 113 is disposed on the dielectric layer 112 and the circuit layer 122. The circuit layer 123 is disposed on the dielectric layer 113. The conductive vias 132 are disposed in the dielectric layer 113 and connect the circuit layer 122 to the circuit layer 123. Specifically, the circuit layers 121, 122, and 123 and the conductive vias 131 and 132 may be made of copper.

Figure 1D:
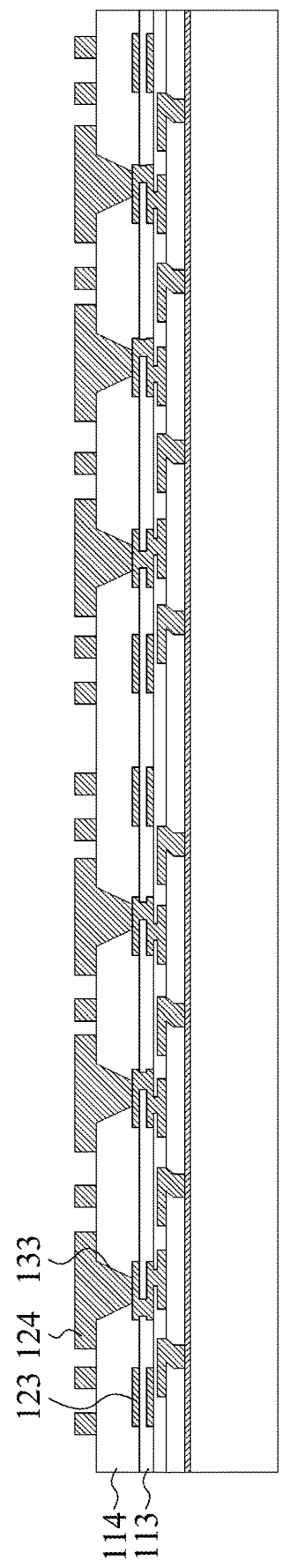

As shown in FIG. 1D, the dielectric layer 114, the circuit layer 124, and a plurality of conductive vias 133 are respectively formed. The dielectric layer 114 is disposed on the dielectric layer 113 and the circuit layer 123. The circuit layer 124 is disposed on the dielectric layer 114. The conductive vias 133 are disposed in the dielectric layer 114 and connect the circuit layer 123 to the circuit layer 124. Specifically, the circuit layer 124 and the conductive vias 133 may be made of copper.

Figure 1E:
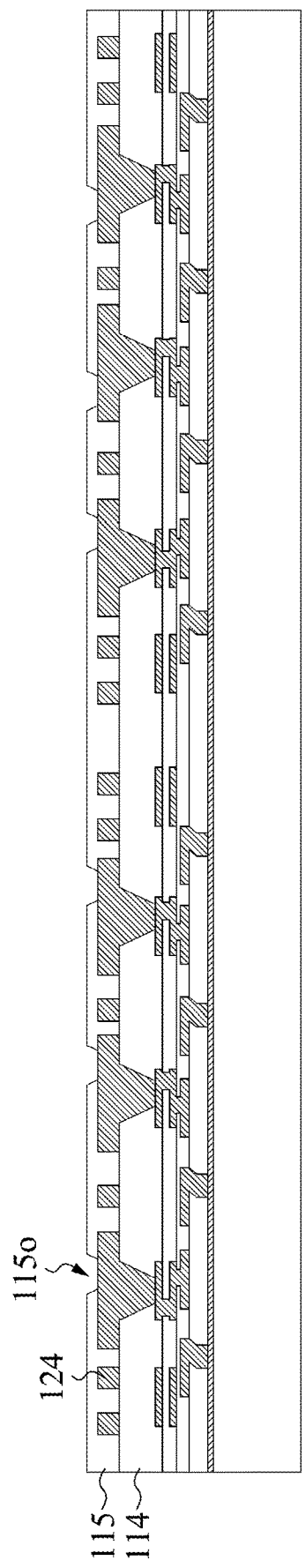

As shown in FIG. 1E, a dielectric layer 115 is formed on the dielectric layer 114 and the circuit layer 124. Then, a plurality of openings 115o are formed in the dielectric layer 115 to expose a plurality of parts of the circuit layer 124. The openings 115o may be formed by laser ablation. The sidewalls of the openings 115o are tilted.

Figure 1F:
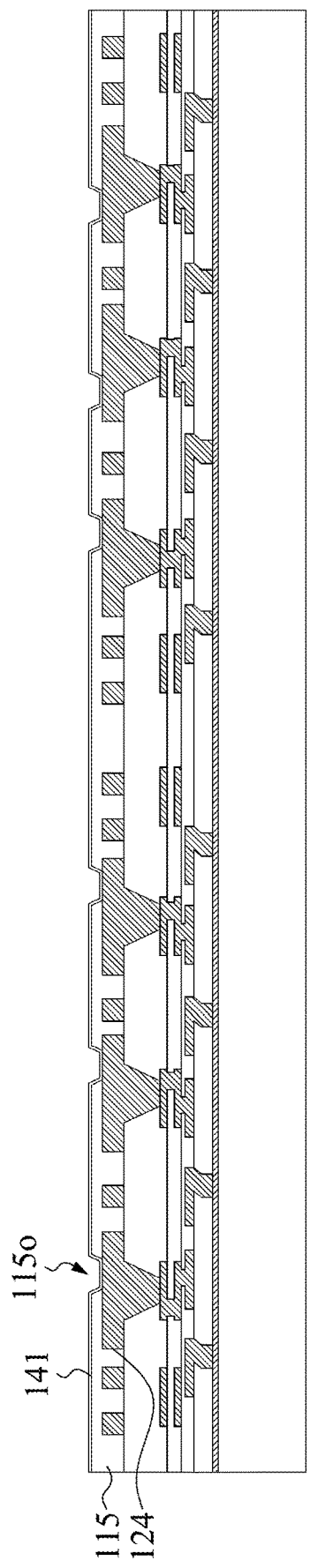

As shown in FIG. 1F, a seed layer 141 is formed on the exposed parts of the circuit layer 124, the sidewalls of the openings 115o, and the top surface of the dielectric layer 115 (i.e., the exposed parts of the circuit layer 124 and the dielectric layer 115). Specifically, the seed layer 141 may be made of copper and is porous-free.

Figure 1G:
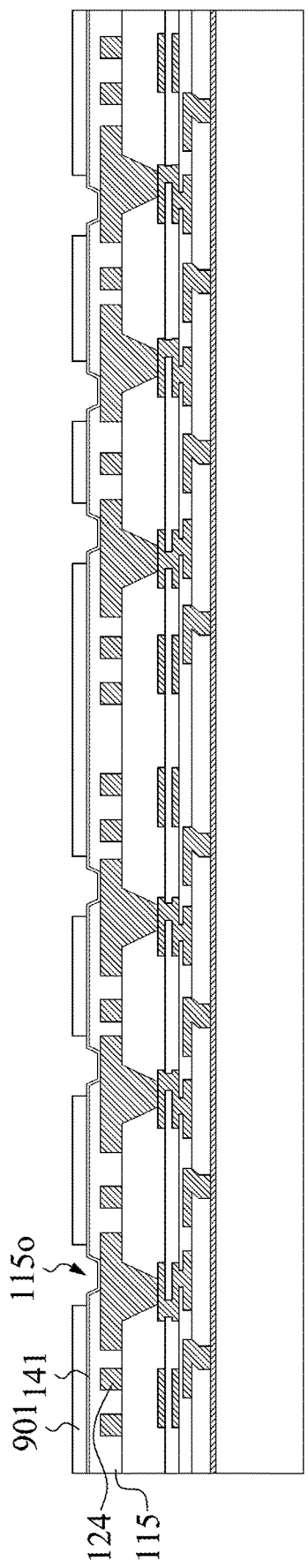

As shown in FIG. 1G, a photoresist 901 is formed on or above the top surface of the dielectric layer 115 or on the seed layer 141. The photoresist 901 exposes the seed layer 141 in the openings 115o (the parts of the seed layer 141 is disposed on the circuit layer 124 and the sidewalls of the openings 115o) and the seed layer 141 adjacent to the openings 115o (the parts of the seed layer 141 is disposed on the top surface of the dielectric layer 115).

Figure 1H:
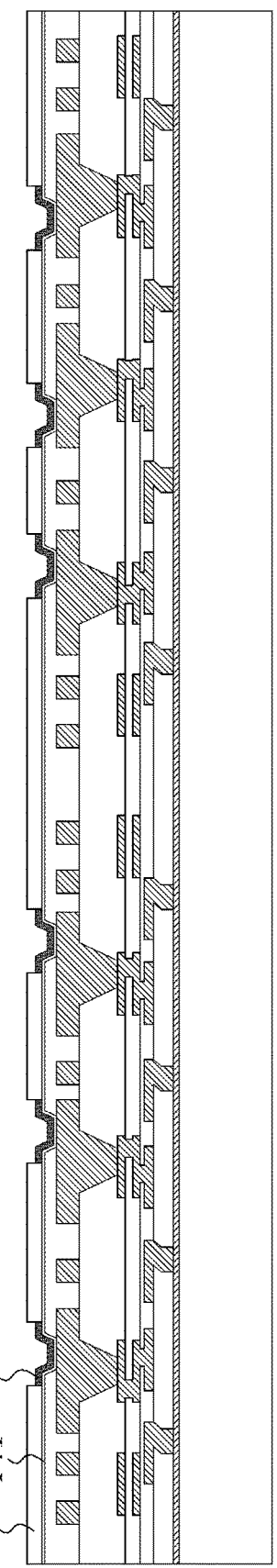

As shown in FIG. 1H, a plurality of bonding layers 151 are formed on the exposed parts of the seed layer 141. The bonding layers 151 are made of porous copper. In some embodiments, first, copper alloy layers are formed on the exposed parts of the seed layer 141. Then, the non-copper elements in the copper alloy layers are removed by the acid leaching process. Therefore, the bonding layers 151 are formed.

Figure 1I:
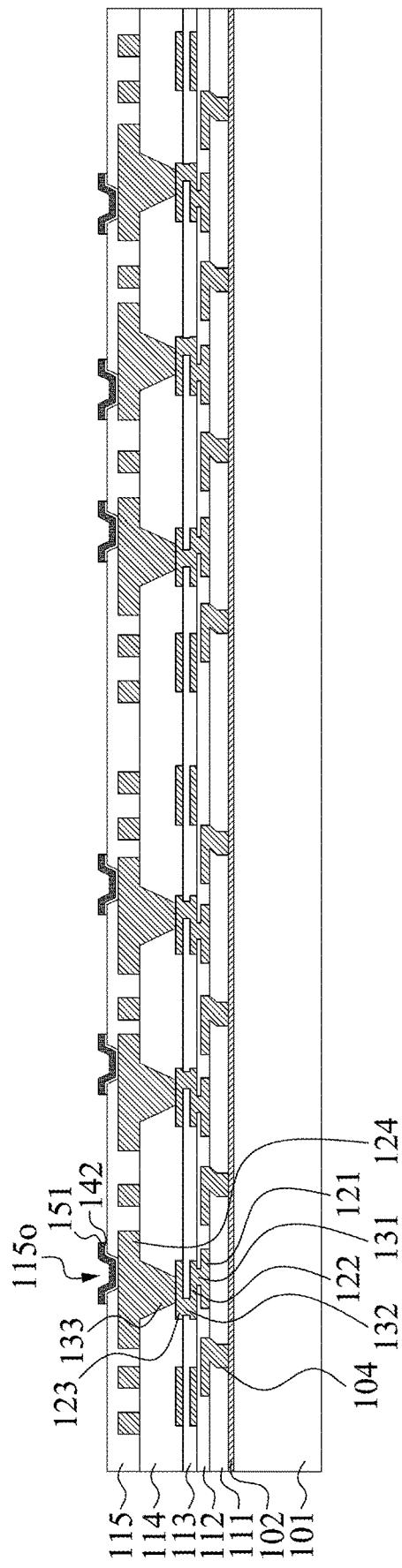

As shown in FIG. 1H and FIG. 1I, the photoresist 901 is removed, and the parts of the seed layer 141 which are not covered by the bonding layers 151 are removed. Therefore, a patterned seed layer 142 is formed.

Figure 1J:
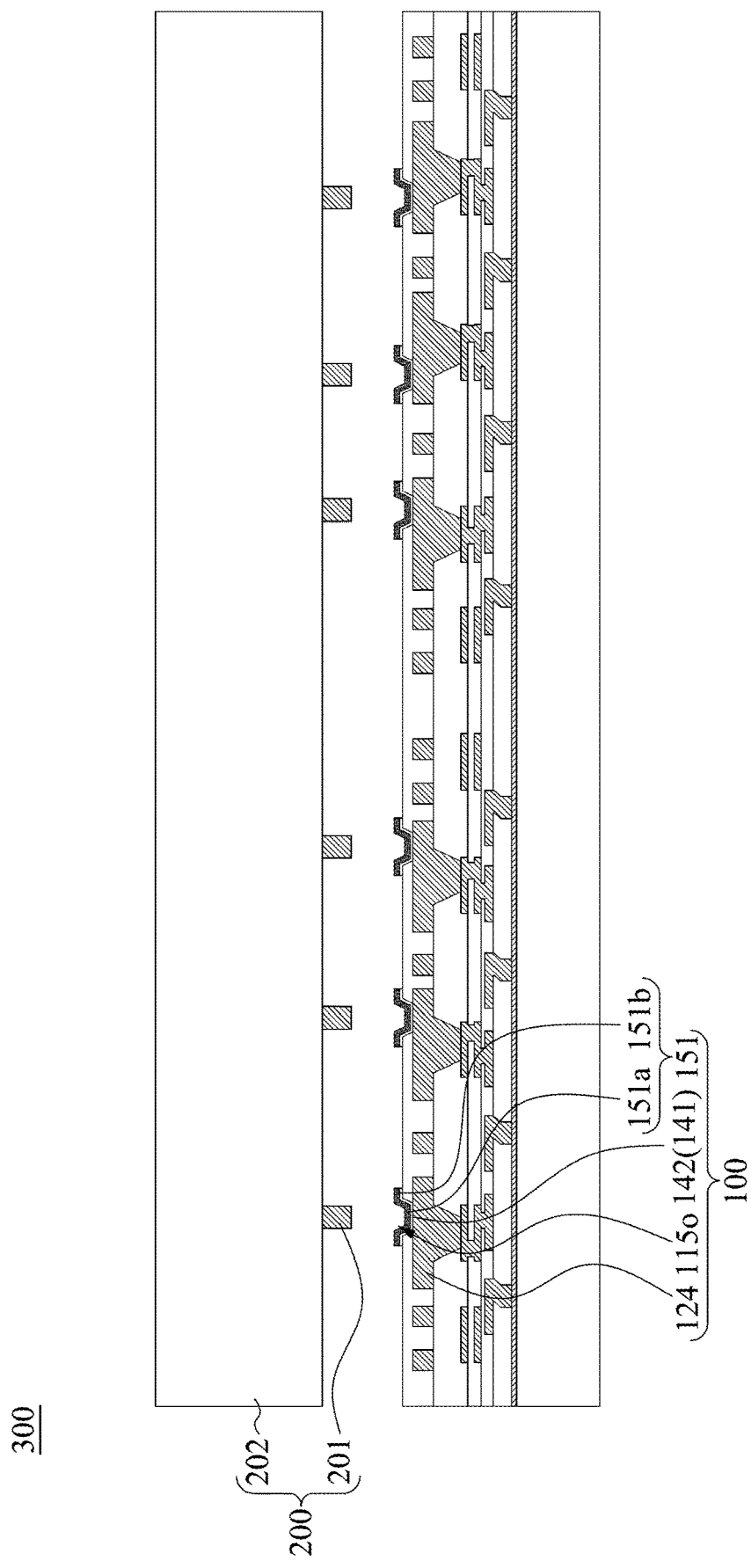
FIG. 1J and FIG. 1K are schematic cross-sectional views of intermediate operations in a method for manufacturing a stacked structure according to one embodiment of this disclosure.
Figure 1K:
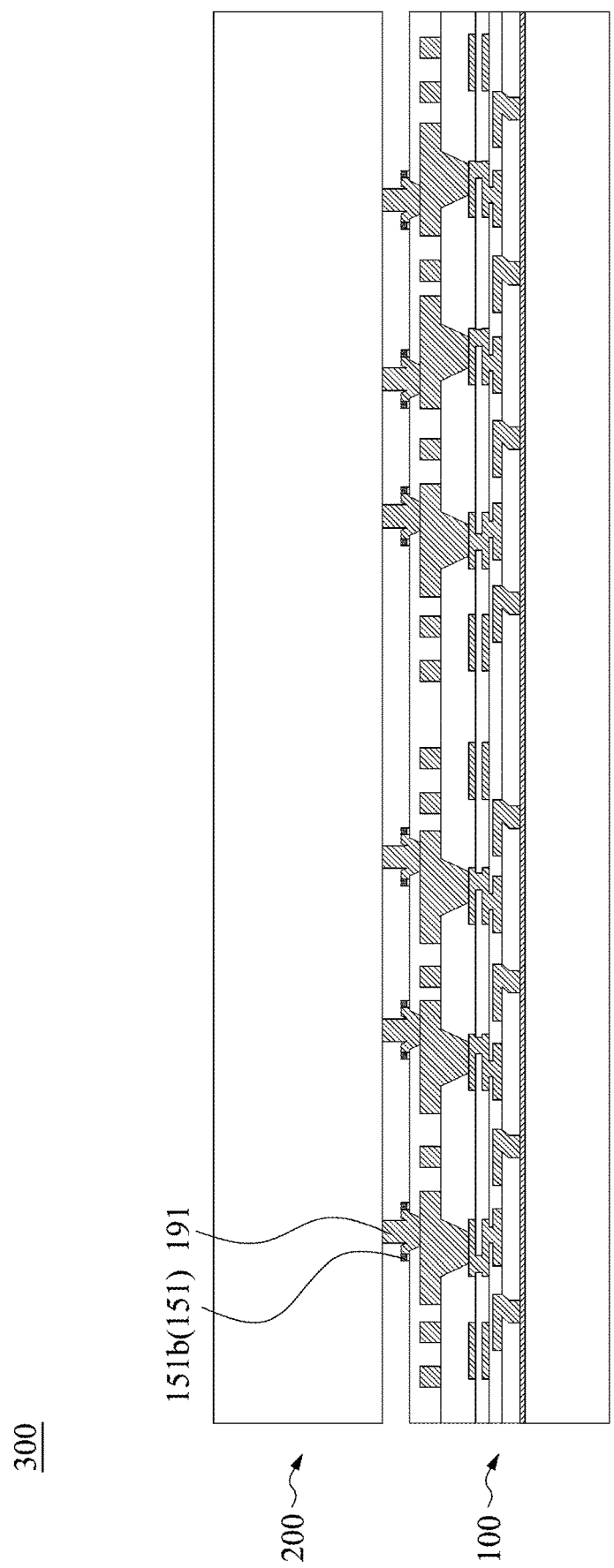

FIG. 1J and FIG. 1K are schematic cross-sectional views of intermediate operations in a method for manufacturing a stacked structure 300 according to one embodiment of this disclosure. As shown in FIG. 1J, the aforementioned circuit board 100 and the chip module 200 are provided. A plurality of bumps 201 (which can be also referred to as pillars) of the chip module 200 may be made of copper.

As shown in FIG. 1J and FIG. 1K, the bumps 201 are bonded to the bonding layers 151, such that the bumps 201 and the bonding layer 151 are bonded with each other to form an integral solid structure 191. The integral solid structure 191 is substantially made of copper. The integral solid structure 191 is connected to the circuit layer 124 and the patterned seed layer 142 (the seed layer 141).

By bonding the bumps 201 and the bonding layers 151, which are both made of copper, the circuit board 100 is bonded to the chip module 200 to form the stacked structure 300. Because the thermal expansion coefficients of the bumps 201 and the bonding layers 151 are the same, the connection portions of the bumps 201 and the bonding layers 151 will not break due to thermal expansion when the stacked structure 300 is put in environments with different temperatures. Therefore, the structure stability of the stacked structure 300 can be effectively improved.

Further, when the bumps 201 are bonded to the bonding layers 151, the sharp corners of the bumps 201 will press the inclined surface of the bonding layers 151, thereby generating a driving force, such that the diffusion rate of the copper atoms in the bumps 201 and the bonding layers 151 can be effectively enhanced. Therefore, when the bumps 201 and the bonding layers 151 are in contact with each other, some of the copper atoms in the bumps 201 will exchange with some of the copper atoms in the bonding layer 151 to form an integral solid structure. Because of the driving force, the material of the integral solid structure becomes copper. Specifically, the bumps 201, the circuit layer 124, the patterned seed layer 142, and the bonding layers 151 are bonding with each other to form a conductive structure.

In addition, because the bonding layers 151 are made of porous copper, the diffusion rate of the copper atoms in the bumps 201 and the bonding layers 151 can be further enhanced when the bumps 201 and the bonding layers 151 are in contact with each other. Therefore, the temperature and the pressure required to carry out the bonding process of the bumps 201 and bonding layer 151 can be effectively lowered. At the same time, because the stacked structure 300 does not need to withstand higher temperature and pressure, the overall structure stability of the stacked structure 300 can be effectively improved.

The temperature required to carry out the bond process may be in a range from about 120° C. to about 250° C. The pressure required to carry out the bonding process may be in a range from about 3 MPa to about 9 MPa. In some embodiments, the temperature required to carry out the bond process may be in a range from about 160° C. to about 200° C. The pressure required to carry out the bonding process may be about 6 MPa.

Figure 2:
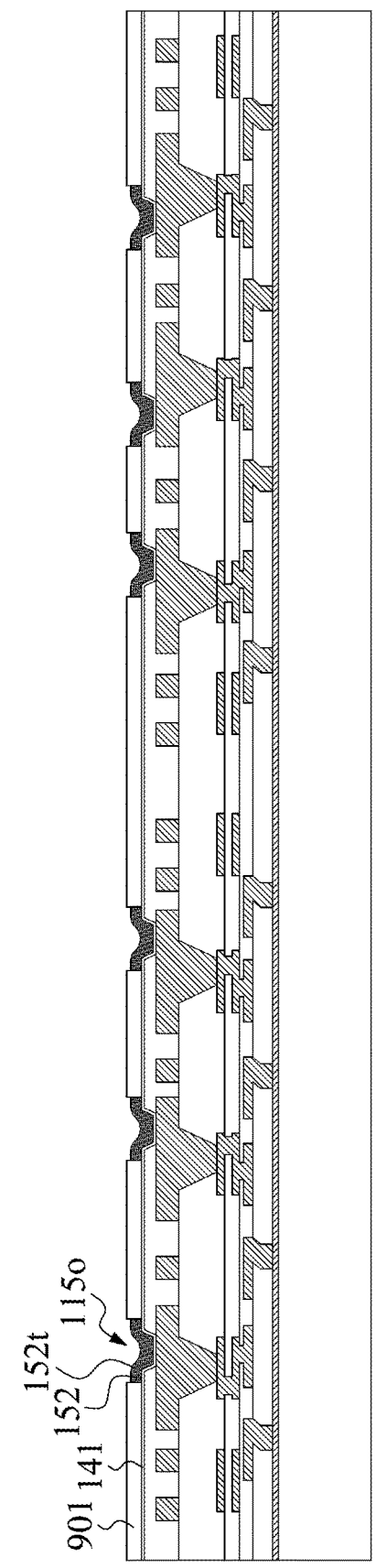
FIG. 2 is a schematic cross-sectional view of an intermediate operation in the method for manufacturing the circuit board according to another embodiment of this disclosure.

FIG. 2 is a schematic cross-sectional view of an intermediate operation in the method for manufacturing a circuit board 100 according to another embodiment of this disclosure. As shown in FIG. 2, this embodiment is similar to the aforementioned embodiment, and the main difference between the two is that, in this embodiment, instead of forming a thin film on the seed layer 141, the bonding layers 152 respectively fill the openings 115o when the bonding layers 152 are formed. At the same time, each of the bonding layers 152 has a concave surface 152t.

The dielectric layers 111, 112, 113, 114, and 115 may be formed by lamination. Embodiments of this disclosure are not limited thereto. The person having ordinary skill in the art can make proper modifications to the dielectric layers 111, 112, 113, 114, and 115 depending on the actual application.

The circuit layers 121, 122, 123, and 124 may be formed by the following operations. First, photoresists (not shown in Figs), for example, dry films, are formed on the dielectric layers 111, 112, 113, and 114. Then, the photoresists are patterned to expose a plurality of parts of the dielectric layers 111, 112, 113, and 114 by lithography processes. Then, the plating process is formed. Finally, the photoresists are removed. Therefore, the circuit layers 121, 122, 123, and 124 are formed.

The conductive vias 131, 132, and 133 may be formed by the following operations. First, blind holes, which may be formed by laser ablation, are formed in the dielectric layers 112, 113, and 114 before the circuit layers 122, 123, and 124 are formed. Then, the conductive vias 131, 132, and 133 are formed by the plating process when the circuit layers 122, 123, and 124 are formed.

It is noted that the number of the dielectric layers and the circuit layers may vary depending on the actual requirements of the circuit board 100 and may not be limited to the aforementioned embodiments.

In another aspect of the disclosure, a circuit board 100 is provided. As shown in FIG. 1I, the circuit board 100 includes a carrier 101, a metal bonding layer 102, a plurality of pads 104, dielectric layers 111, 112, 113, 114, and 115, circuit layers 121, 122, 123, and 124, a plurality of conductive vias 131, a plurality of conductive vias 132, a plurality of conductive vias 133, a patterned seed layer 142, and a plurality of bonding layers 151. The metal bonding layer 102 is disposed on the carrier 101. The dielectric layer 111 is disposed on the metal bonding layer 102. The pads 104 are disposed on the metal bonding layer 102 and in the dielectric layer 111. The dielectric layer 112 is disposed on the dielectric layer 111 and the circuit layer 121. The circuit layer 121 is disposed in the dielectric layer 112 and on the dielectric layer 111. The dielectric layer 113 is disposed on the dielectric layer 112 and the circuit layer 122. The circuit layer 122 is disposed in the dielectric layer 113 and on the dielectric layer 112. The conductive vias 131 are disposed in the dielectric layer 112 and connect the circuit layer 121 to the circuit layer 122. The dielectric layer 114 is disposed on the dielectric layer 113 and the circuit layer 123. The circuit layer 123 is disposed in the dielectric layer 114 and on the dielectric layer 113. The dielectric layer 114 is disposed on the dielectric layer 113 and the circuit layer 123. The circuit layer 123 is disposed in the dielectric layer 114 and on the dielectric layer 113. The conductive vias 132 are disposed in the dielectric layer 113 and connect the circuit layer 122 to the circuit layer 123. The dielectric layer 115 is disposed on the dielectric layer 114 and the circuit layer 124. The circuit layer 124 is disposed in the dielectric layer 115 and on the dielectric layer 114. The circuit layer 124 is made of copper. The conductive vias 133 are disposed in the dielectric layer 114 and connect the circuit layer 123 to the circuit layer 124. The dielectric layer 115 has a plurality of openings 115o to expose a plurality of parts of the circuit layer 124. The patterned seed layer 142 is disposed on the exposed parts of the circuit layer 124 and sidewalls of the openings 115o. The patterned seed layer 142 is made of copper. The bonding layers 151 are respectively disposed on the patterned seed layer 142. The bonding layers 151 are made of porous copper.

The sidewalls of the openings 115o are tilted. The bonding layers 151 and the patterned seed layer 142 are conformally disposed on the exposed parts of the circuit layer 124 and the sidewalls of the openings 115o. Embodiments of this disclosure are not limited thereto. In some other embodiments, for example, as shown in FIG. 2, the openings 115o are respectively filled with the bonding layers 152, and each of the bonding layers 152 has a concave surface 152t.

In another aspect of the disclosure, a stacked structure 300 is provided. As shown in FIG. 1J and FIG. 1K, the stacked structure 300 includes the circuit board 100 and a chip module 200. The chip module 200 includes a body 202 and a plurality of bumps 201. The bumps 201 are disposed on the body 202. The bumps 201 are made of copper. Each of the bonding layers 151 includes a first part 151a, and the first parts 151a are respectively disposed in the openings 115o. The bumps 201 are bonded to the first parts 151a to form an integral solid structure 191. The integral solid structure 191 is substantially made of copper. The integral solid structure 191, the circuit layer 124, the patterned seed layer 142 (the seed layer 141) is connected to each other.

The maximum width of each of the bumps 201 is less than the maximum width of each of the openings 115o. Therefore, the sharp corners of the bumps 201 are ensured to press the inclined surface of the bonding layers 151.

In some embodiments, each of the bonding layers 151 further includes a second part 151b. The second parts 151b are disposed outside the openings 115o, and the second parts are made of porous copper. Because the bumps 201 only press the first parts 151a in the openings 115o, the second parts 151b outside the openings 115o will not be pressed by the bumps. Therefore, the material of the second parts 151b will not change and maintains as porous copper.

The bumps 201 are bonded to the bonding layers 151. Because the thermal expansion coefficients of the bumps 201 and the bonding layers 151 are the same, the connection portions of the bumps 201 and the bonding layers 151 will not break due to different thermal expansions. Further, when the bumps 201 are bonded to the bonding layers 151, the sharp corners of the bumps 201 will press the inclined surface of the bonding layers 151, thereby generating a driving force, such that the diffusion rate of the copper atoms in the bumps 201 and the bonding layers 151 can be effectively enhanced.

In addition, because the bonding layers 151 are made of porous copper, the exchange rate of the copper atoms in the bumps 201 and the bonding layers 151 can be further enhanced when the bumps 201 and the bonding layers 151 are in contact with each other. Therefore, the temperature and the pressure required to carry out the bonding process of the bumps 201 and bonding layer 151 can be effectively lowered. At the same time, because the stacked structure 300 does not need to withstand higher temperature and pressure, the overall structure stability of the stacked structure 300 can be effectively improved.

Figure 3A:
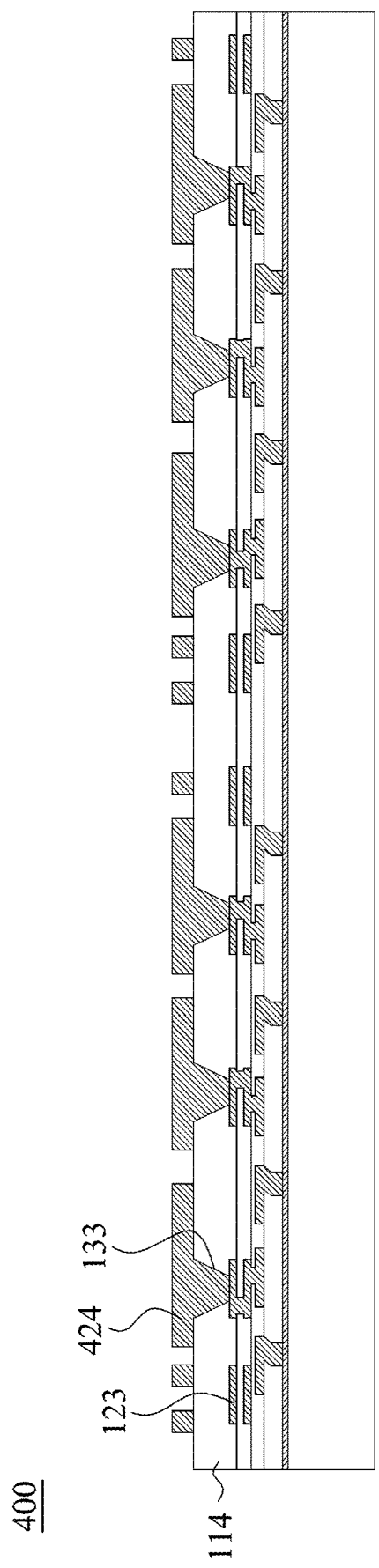
FIGS. 3A to 3H are schematic cross-sectional views of intermediate operations in a method for manufacturing a circuit board according to one embodiment of this disclosure.
Figure 3B:
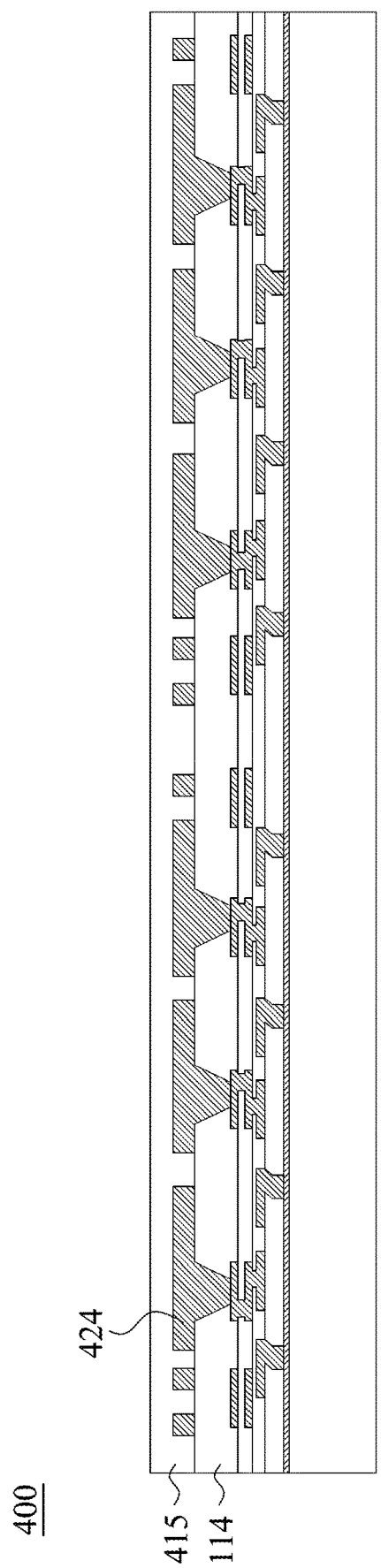
Figure 3C:
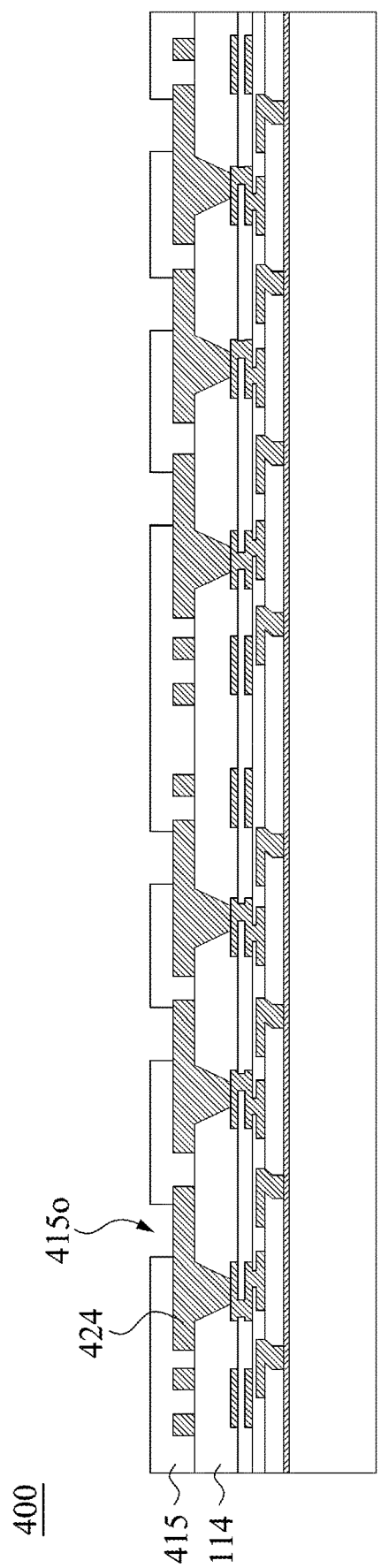
Figure 3D:
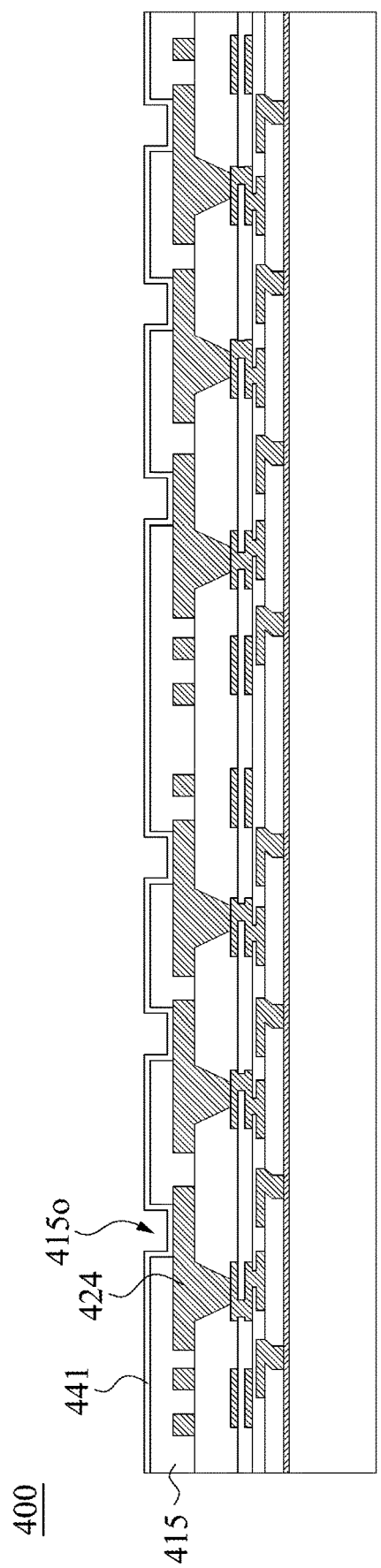
Figure 3E:
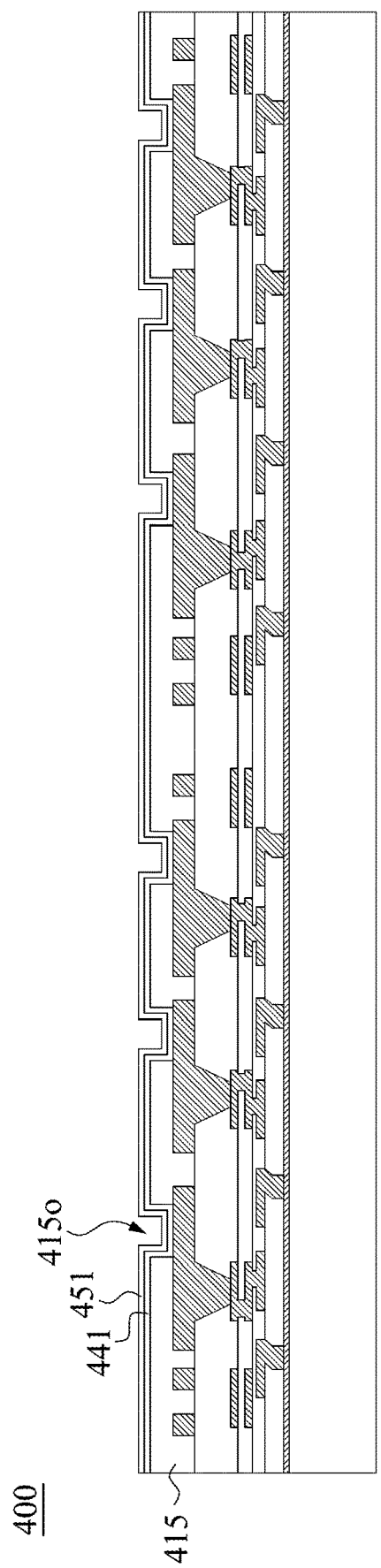
Figure 3F:
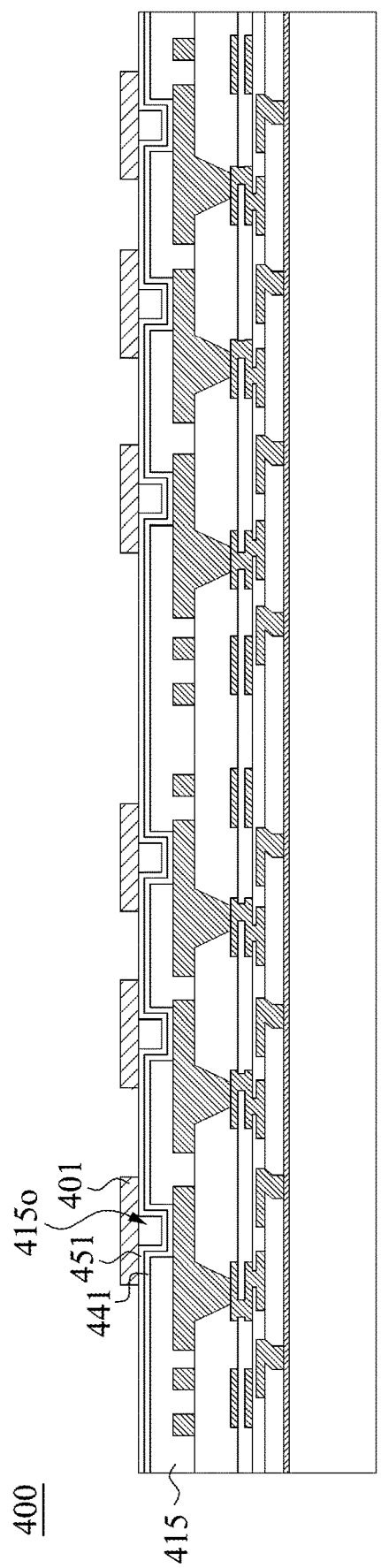
Figure 3G:
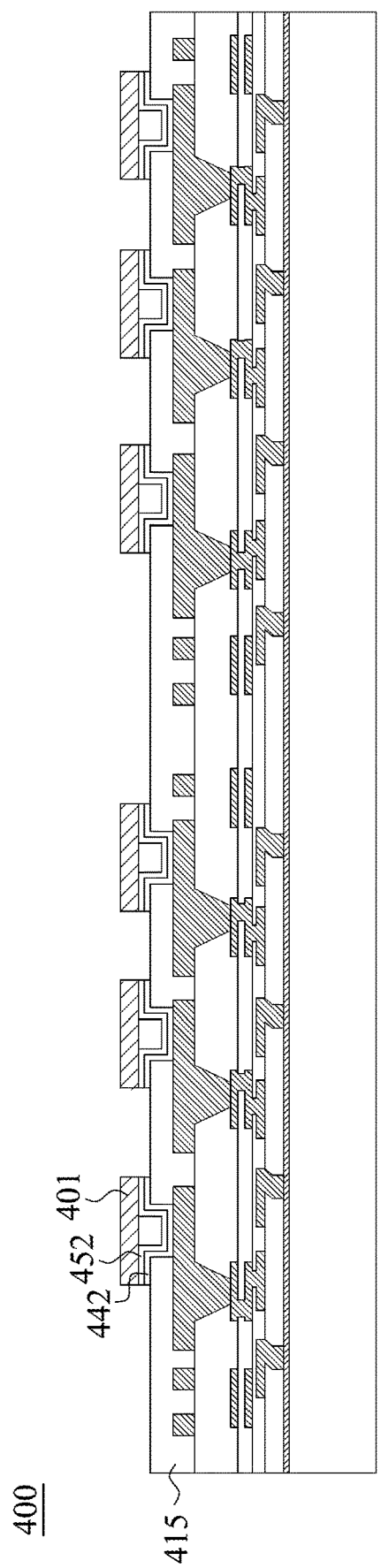
Figure 3H:
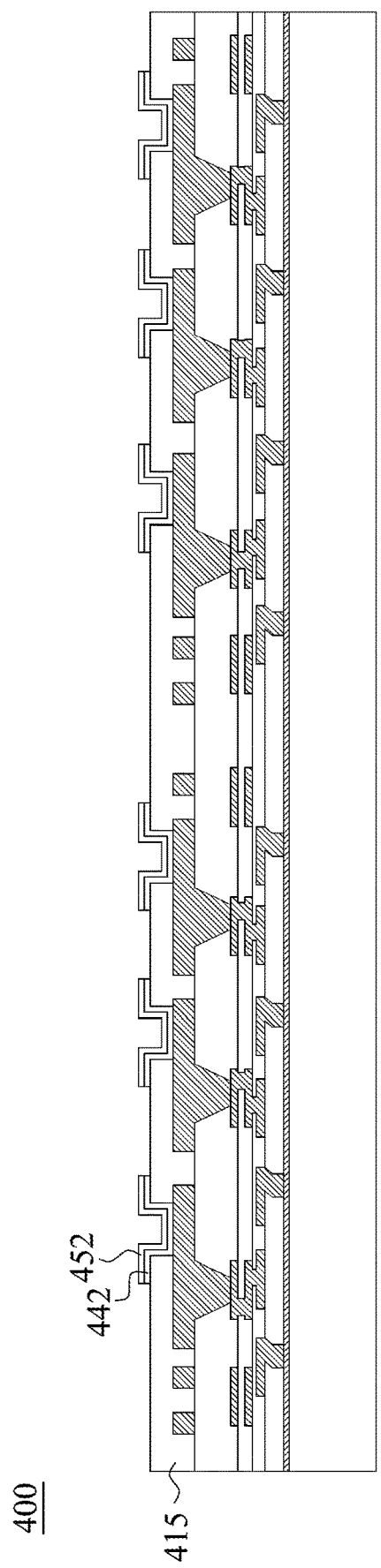
Figure 3I:
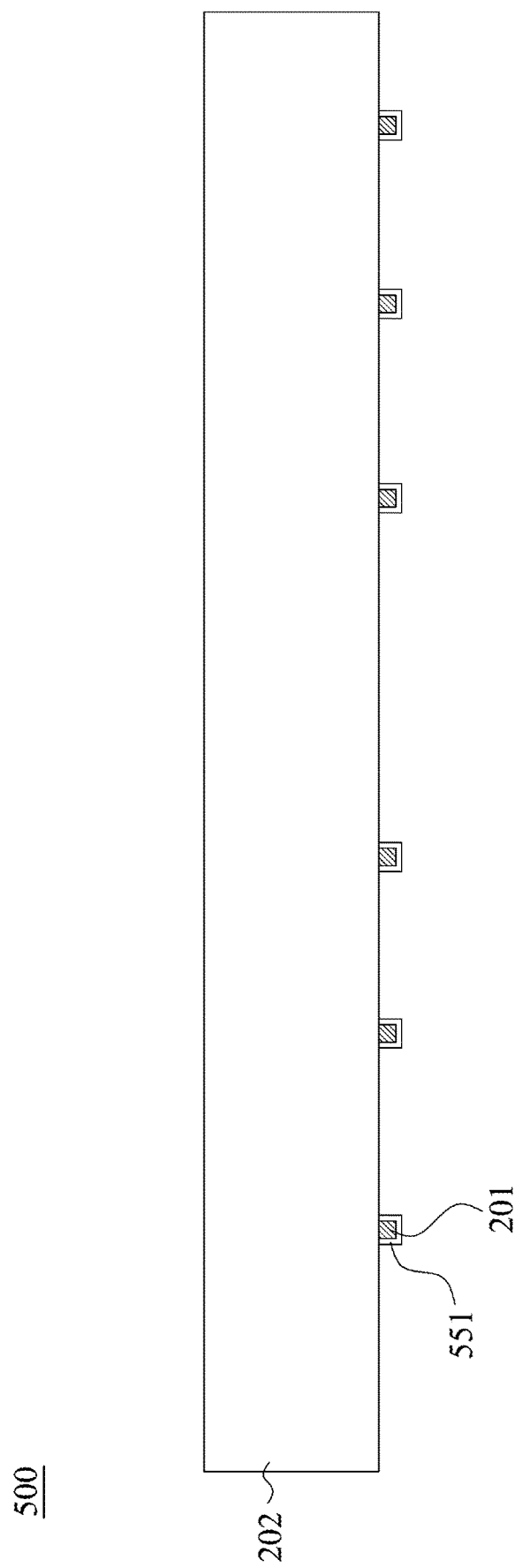
FIG. 3I is a schematic cross-sectional view of intermediate operations in a method for manufacturing a chip module according to one embodiment of this disclosure.

FIGS. 3A to 3H are schematic cross-sectional views of intermediate operations in a method for manufacturing a circuit board 400 according to one embodiment of this disclosure. It should be pointed out that operations for forming the circuit board 400 before the structure shown in FIG. 3A are substantially the same as the operations for forming the circuit board 100 shown in FIGS. 1A-1C, and the related detailed descriptions may refer to the foregoing paragraphs and are not discussed again herein. The differences between the present embodiment and the embodiment in FIGS. 1A-1I are that operations of forming a patterned bonding layer 452 as shown in FIG. 3H and a bonding layer 551 as shown in FIG. 3I.

As shown in FIG. 3A, the dielectric layer 114, a circuit layer 424, and a plurality of conductive vias 133 are respectively formed. The dielectric layer 114 is disposed on the dielectric layer 113 and the circuit layer 123. The circuit layer 424 is disposed on the dielectric layer 114. The conductive vias 133 are disposed in the dielectric layer 114 and connect the circuit layer 123 to the circuit layer 424. Specifically, the circuit layer 424 and the conductive vias 133 may be made of copper.

As shown in FIG. 3B and FIG. 3C, a dielectric layer 415 is formed on the dielectric layer 114 and the circuit layer 424. Then, openings 415o shown in FIG. 3C are formed in the dielectric layer 415 to expose a plurality of parts of the circuit layer 424. The openings 415o may be formed by laser ablation. The sidewalls of the openings 415o are substantially perpendicular to a top surface of the dielectric layer 415.

As shown in FIG. 3D, a seed layer 441 is formed on the exposed parts of the circuit layer 424, the sidewalls of the openings 415o, and the top surface of the dielectric layer 415. In some embodiments, the seed layer 441 may be made of copper.

As shown in FIG. 3E, the bonding layer 451 is conformally formed on the seed layer 441. Portions of the bonding layer 451 are formed in the openings 415o of the dielectric layer 415 below the top surface of the dielectric layer 415, and other portions of the bonding layer 451 are formed above the top surface of the dielectric layer 415. Specifically, the bonding layer 451 may be made of porous copper. In some embodiments, first, copper alloy layers are formed on the bonding layer 451. Then, the non-copper elements in the copper alloy layers are removed by the acid leaching process. Therefore, the bonding layer 451 is formed.

As shown in FIG. 3F, a photoresist 401 is formed above a top surface of the bonding layer 451. The photoresist 401 covers the bonding layer 451 in the openings 415o and covers the bonding layer 451 around the openings 415o. Specifically, the photoresist 401 is vertically above the circuit layer 424 and is spaced apart from the bonding layer 451 in the openings 415o. Further, the photoresist 401 is in contact with the bonding layer 451 around the openings 415o. In other words, the photoresist 401 exposes a portion of the bonding layer 451 between the adjacent two of the openings 415o.

As shown in FIG. 3G and FIG. 3H, after the photoresist 401 shown in FIG. 3F is formed, the portions of the bonding layer 451 shown in FIG. 3F exposed from the photoresist 401 are removed, and portions of the bonding layer 451 that are covered by the photoresist 401 are remained on the dielectric layer 415. Then, as shown in FIG. 3H, the photoresist 401 shown in FIG. 3G is removed. Therefore, the patterned seed layer 442 and the patterned bonding layer 452 are formed.

FIG. 3I is a schematic cross-sectional view of intermediate operations in a method for manufacturing a chip module 500 according to one embodiment of this disclosure. As shown in FIG. 3I, a chip module 500 includes a body 202 and a plurality of bumps 201 (which can be also referred to as pillars) disposed on the body 202, and a plurality of bonding layers 551 wrapping and in contact with the bumps 201 respectively.

Specifically, the bonding layer 551 is conformally formed on the bump 201, is disposed on a top surface of the bump 201 that is opposite to the body 202 of the chip module 500, and is disposed on a side wall of the bump 201. Further, an end of the bonding layer 551 is in contact with the body 202 of the chip module 500.

In some embodiments, the bumps 201 are made of copper and are porous-free. In some embodiments, the bonding layers 551 are made of porous copper. In some embodiments, first, copper alloy layers are formed on the bumps 201. Then, the non-copper elements in the copper alloy layers are removed by the acid leaching process. Therefore, the bonding layers 551 are formed.

Figure 3J:
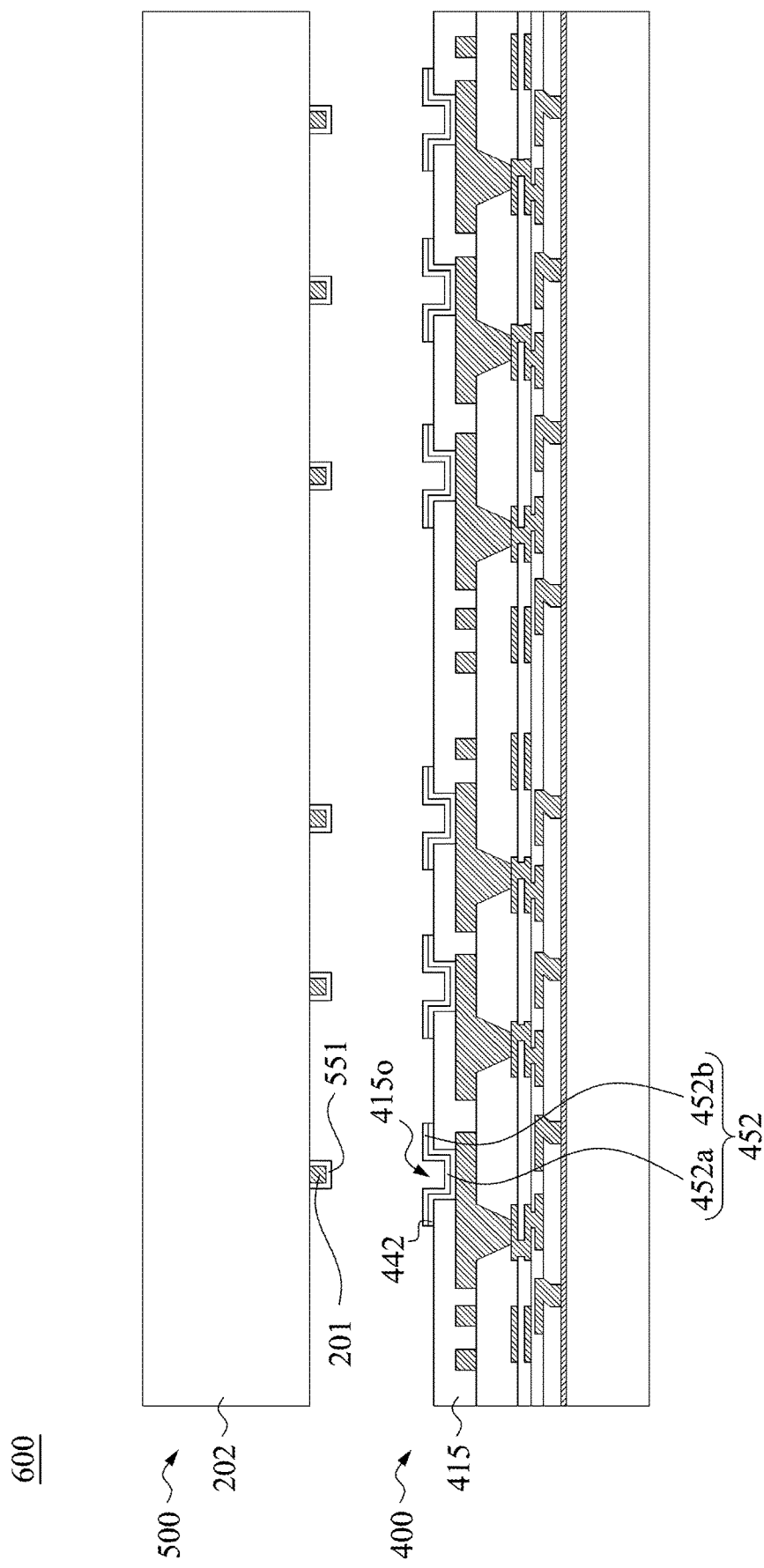
FIG. 3J and FIG. 3K are schematic cross-sectional views of intermediate operations in a method for manufacturing another stacked structure according to one embodiment of this disclosure.
Figure 3K:
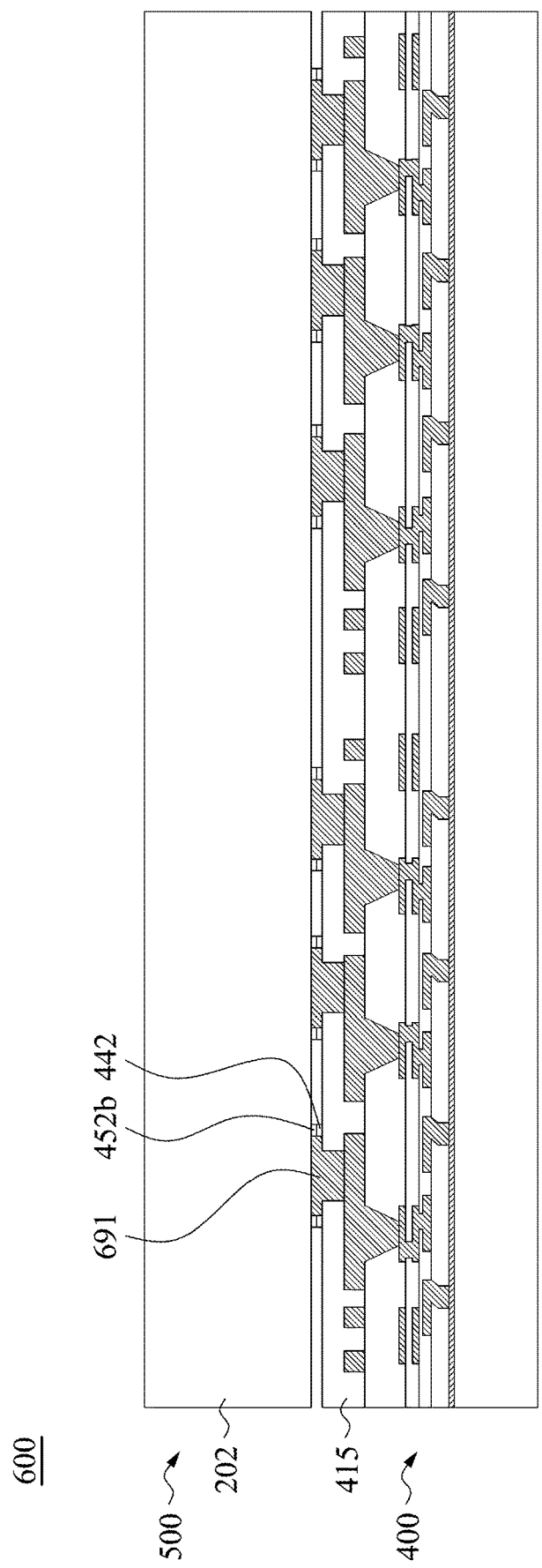

FIG. 3J and FIG. 3K are schematic cross-sectional views of intermediate operations in a method for manufacturing stacked structure 600 according to one embodiment of this disclosure. As shown in FIG. 3J, the aforementioned circuit board 400 and the chip module 500 are provided.

As shown in FIG. 3J and FIG. 3K, the bonding layers 551 wrapping the bumps 201 are bonded to the patterned bonding layer 452 on the circuit board 400, such that the bonding layer 551 and the patterned bonding layer 452 are bonded with each other to form an integral solid structure 691 as shown in FIG. 3K. The integral solid structure 691 is substantially made of copper. The integral solid structure 691 is connected to the circuit layer 424 and the patterned seed layer 442 (the seed layer 441).

Specifically, the patterned seed layer 442 of the circuit board 400 includes a first portion in the opening 415o of the dielectric layer 415 and a second portion outside the opening 415o. The bonding layer 551 of the chip module 500 is spaced apart from the patterned seed layer 442 of the circuit board 400 by the patterned bonding layer 452. In some embodiments, the patterned bonding layer 452 of the chip module 400 is in contact with the body 202 of the chip module 500.

In some embodiments, each of the patterned bonding layer 452 includes a first portion 452a and a second portion 452b (shown in FIG. 3J). The first portion 452a is disposed in the openings 415o (shown in FIG. 3J). The bump 201 and the bonding layer 551 are bonded to the first parts 452a to form an integral solid structure 691. The second portion 452b is disposed outside the openings 415o, and the second portion 452b is made of porous copper. Because the bumps 201 only press the first portion 451a in the openings 415o, the second portion 451b outside the openings 415o will not be pressed by the bumps. Therefore, the material of the second portion 451b will not change and maintains as porous copper.

By bonding the bonding layers 551 wrapping the bumps 201 and the patterned bonding layer 452, which are both made of copper, the circuit board 400 is bonded to the chip module 500 to form the stacked structure 600. Because the thermal expansion coefficients of the bumps 201 and the bonding layers 452 and 551 are the same, the connection portions of the bumps 201 and the bonding layers 452 and 551 will not break due to thermal expansion when the stacked structure 600 is put in environments with different temperatures. Therefore, the structure stability of the stacked structure 600 can be effectively improved.

In addition, because the bonding layers 452 and 551 are made of porous copper, the diffusion rate or the exchange rate of the copper atoms in the bumps 201 and the bonding layers 452 and 551 can be further enhanced when the bumps 201 and the bonding layers 452 and 551 are in contact with each other. Therefore, the temperature and the pressure required to carry out the bonding process of the bumps 201 and bonding layers 452 and 551 can be effectively lowered. At the same time, because the stacked structure 600 does not need to withstand higher temperature and pressure, the overall structure stability of the stacked structure 600 can be effectively improved.

The temperature required to carry out the bond process may be in a range from about 120° C. to about 250° C. The pressure required to carry out the bonding process may be in a range from about 3 MPa to about 9 MPa. In some embodiments, the temperature required to carry out the bond process may be in a range from about 160° C. to about 200° C. The pressure required to carry out the bonding process may be about 6 MPa.

Figure 4A:
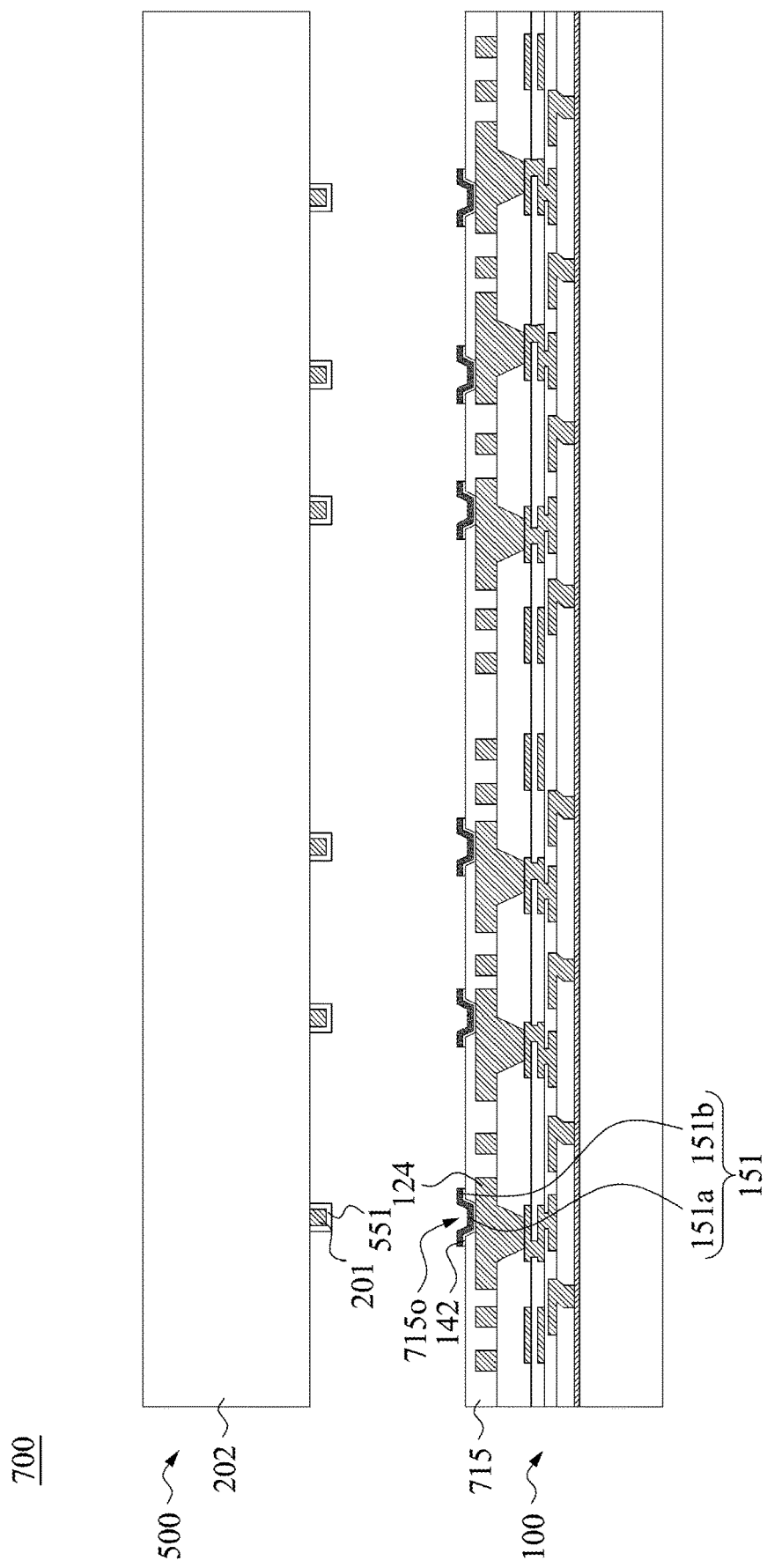
FIG. 4A and FIG. 4B are schematic cross-sectional views of intermediate operations in a method for manufacturing another stacked structure according to one embodiment of this disclosure.
Figure 4B:
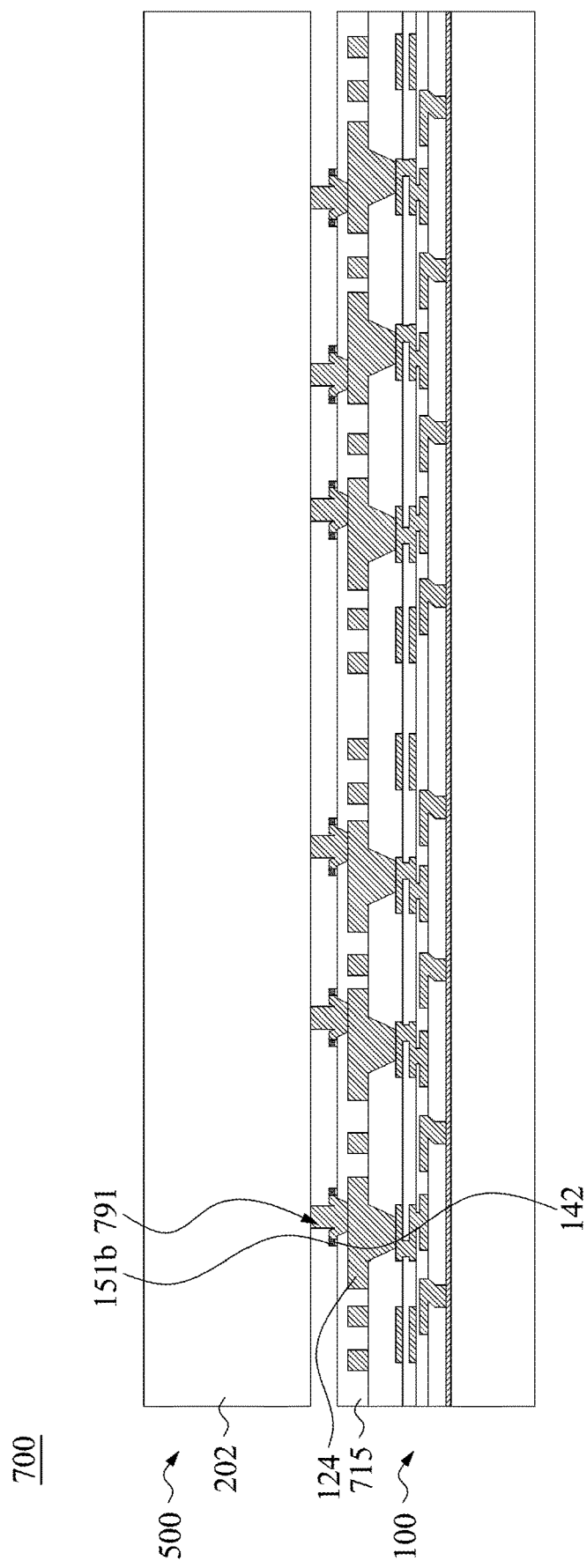

FIG. 4A and FIG. 4B are schematic cross-sectional views of intermediate operations in a method for manufacturing another stacked structure 700 according to one embodiment of this disclosure. As shown in FIG. 4A and FIG. 4B, this embodiment is similar to the aforementioned embodiment, and the main difference between the two is that, in this embodiment, the sidewalls of the openings 715o (shown in FIG. 4A) of the dielectric layer 715 (shown in FIG. 4A) are tapered upward. Formation of the sidewalls of the openings 715o of the dielectric layer 715 is the same as formation of the sidewalls of the openings 115o of the dielectric layer 115 as shown in FIG. 1E, and thus detailed description thereof is not repeated for the sake of brevity.

As shown in FIG. 4A and FIG. 4B, when the bonding layers 551 wrapping the bumps 201 (which can be also referred to as pillars) are bonded to the bonding layers 151, the sharp corners of the bonding layers 551 will press the inclined surface of the bonding layers 151, thereby generating a driving force, such that the diffusion rate of the copper atoms in the bonding layers 151 and 551 can be effectively enhanced.

Therefore, when the bonding layers 151 and 551 are in contact with each other, some of the copper atoms in the bonding layers 551 will exchange with some of the copper atoms in the bonding layer 151 to form an integral solid structure 791 shown in FIG. 4B including the bumps 201 and the bonding layers 151 and 551. Specifically, the bumps 201, the bonding layers 151 and 551, the circuit layer 124, and the patterned seed layer 142 are bonding with each other to form a conductive structure. In addition, because the thermal expansion coefficients of the bumps the bonding layers 151 and 551 are the same, the connection portions of the bonding layers 151 and 551 will not break due to different thermal expansions.

In addition, because the bonding layers 151 and 551 are made of porous copper, the exchange rate of the copper atoms in the bonding layers 151 and 551 can be further enhanced when the bonding layers 151 and 551 are in contact with each other. Therefore, the temperature and the pressure required to carry out the bonding process of the bonding layers 151 and 551 can be effectively lowered. At the same time, because the stacked structure 700 does not need to withstand higher temperature and pressure, the overall structure stability of the stacked structure 700 can be effectively improved.

In some embodiments, each of the bonding layer 151 includes a first portion 151a and a second portion 151b (shown in FIG. 4A). The first portion 151a is disposed in the openings 715o. The bump 201 and the bonding layer 551 are bonded to the first parts 151a to form an integral solid structure 791. The second portion 151b is disposed outside the openings 715o, and the second portion 151b is made of porous copper. Because the bump 201 and the bonding layer 551 only press the first portion 151a in the openings 715o, the second portion 151b outside the openings 715o will not be pressed by the bumps. Therefore, the material of the second portion 151b will not change and maintains as porous copper.

Figure 5A:
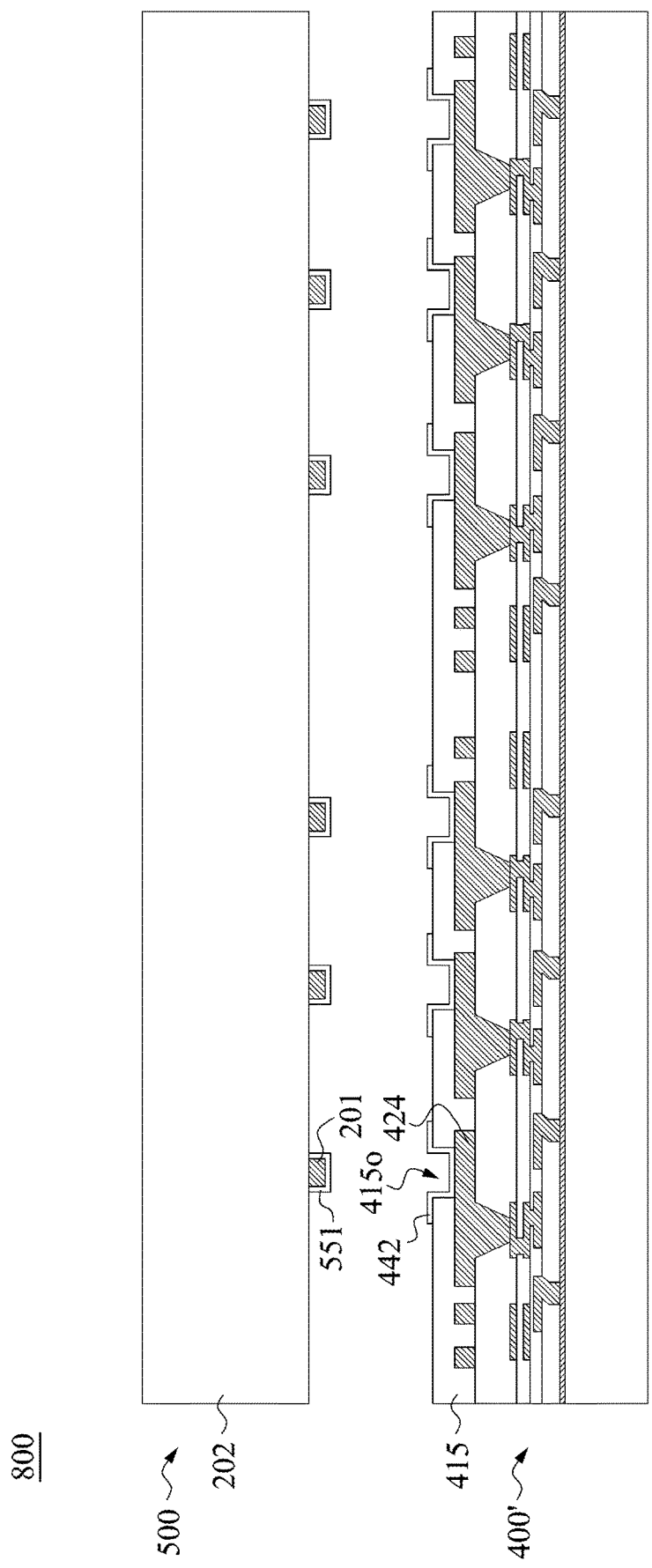
FIG. 5A and FIG. 5B are schematic cross-sectional views of intermediate operations in a method for manufacturing another stacked structure according to one embodiment of this disclosure.
Figure 5B:
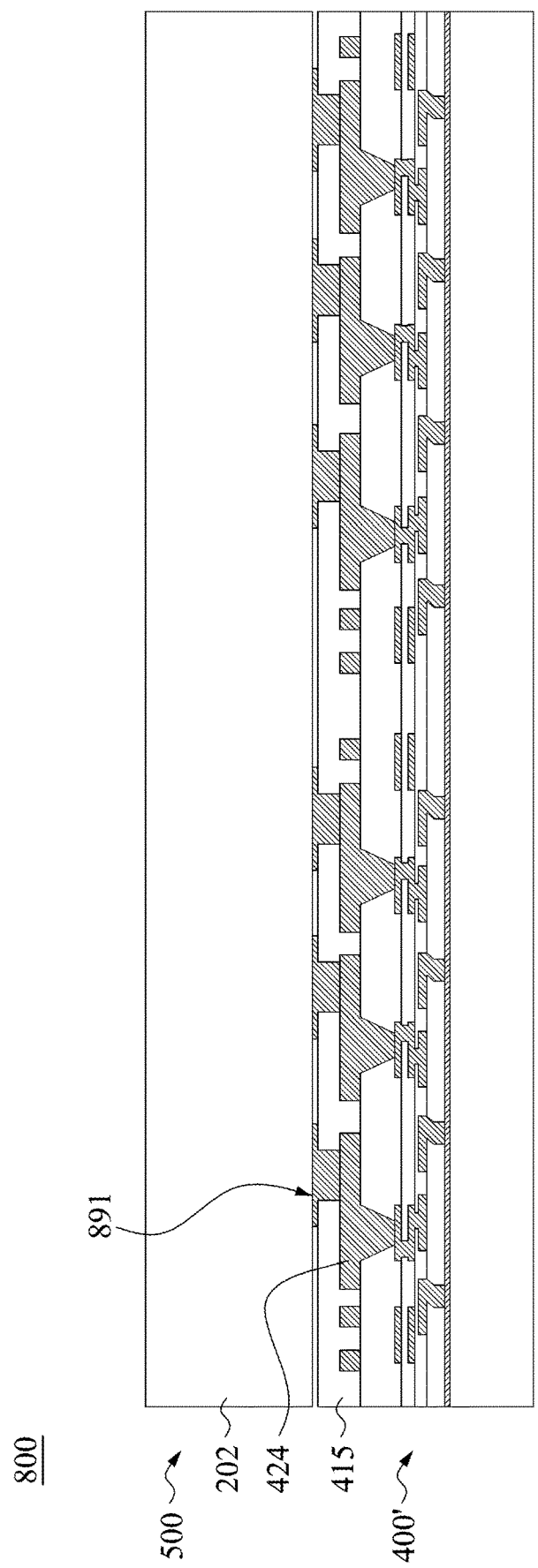

FIG. 5A and FIG. 5B are schematic cross-sectional views of intermediate operations in a method for manufacturing another stacked structure 800 according to one embodiment of this disclosure. As shown in FIG. 5A and FIG. 5B, this embodiment is similar to the aforementioned embodiment, and the main difference between the two is that, in this embodiment, the circuit board 400' of the stacked structure 800 is not disposed the patterned bonding layer 452 as shown in FIG. 3H on the patterned seed layer 442.

As shown in FIG. 5A and FIG. 5B, the bonding layers 551 wrapping the bumps 201 (which can be also referred to as pillars) are bonded to and in contact with the patterned seed layer 442 (the seed layer 441) on the circuit board 400', such that the bonding layer 551 and the patterned seed layer 442 are bonded with each other to form an integral solid structure 891 as shown in FIG. 5B. The integral solid structure 891 is substantially made of copper. The integral solid structure 891 is connected to the circuit layer 424.

Specifically, the patterned seed layer 442 of the circuit board 400' includes a first portion in the opening 415o of the dielectric layer 415 and a second portion outside the opening 415o. The bonding layer 551 is spaced apart from the second portion of the patterned seed layer 442.

By bonding the bonding layers 551 wrapping the bumps 201 and the patterned seed layer 442, which are both made of copper, the circuit board 400' is bonded to the chip module 500 to form the stacked structure 800. Because the thermal expansion coefficients of the bonding layers 551 and the patterned seed layer 442 are the same, the connection portions of the bonding layers 551 and the patterned seed layer 442 will not break due to thermal expansion when the stacked structure 800 is put in environments with different temperatures. Therefore, the structure stability of the stacked structure 800 can be effectively improved.

In addition, because the bonding layers 551 are made of porous copper, the diffusion rate or the exchange rate of the copper atoms in the bonding layers 551 and the patterned seed layer 442 can be further enhanced when the bonding layers 551 and the patterned seed layer 442 are in contact with each other. Therefore, the temperature and the pressure required to carry out the bonding process of the bonding layers 551 and the patterned seed layer 442 can be effectively lowered. At the same time, because the stacked structure 800 does not need to withstand higher temperature and pressure, the overall structure stability of the stacked structure 800 can be effectively improved.

The temperature required to carry out the bond process may be in a range from about 120° C. to about 250° C. The pressure required to carry out the bonding process may be in a range from about 3 MPa to about 9 MPa. In some embodiments, the temperature required to carry out the bond process may be in a range from about 160° C. to about 200° C. The pressure required to carry out the bonding process may be about 6 MPa.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. A chip module, comprising:
   a chip body;
   a bump disposed on the chip body; and
   a first bonding layer wrapping around an entirety of a sidewall of the bump, wherein the first bonding layer is made of porous copper and the bump is made of porous-free copper.

2. The chip module of claim 1, wherein the first bonding layer is conformally formed on the bump.

3. The chip module of claim 1, wherein the first bonding layer is in contact with the bump.

4. The chip module of claim 1, wherein the first bonding layer is disposed on a top surface of the bump that is opposite to the chip body.

5. The chip module of claim 1, wherein the first bonding layer is in contact with the chip body.

6. A stacked structure, comprising:
   the chip module of claim 1; and
   a circuit board, comprising:
      a circuit layer;
      a dielectric layer over the circuit layer and having an opening to expose a part of the circuit layer, wherein the first bonding layer of the chip module is in the opening; and
      a patterned seed layer between the exposed part of the circuit layer and the first bonding layer of the chip module and on a sidewall of the opening, wherein the bump and the first bonding layer of the chip module and the circuit layer and the patterned seed layer of the circuit board are bonded with each other to form an integral solid structure.

7. The stacked structure of claim 6, wherein the patterned seed layer of the circuit board are made of copper.

8. The stacked structure of claim 6, wherein the patterned seed layer of the circuit board is porous-free.

9. The stacked structure of claim 6, wherein the first bonding layer of the chip module is in contact with the patterned seed layer of the circuit board.

10. The stacked structure of claim 6, further comprising a second bonding layer between the patterned seed layer of the circuit board and the first bonding layer of the chip module, wherein the patterned seed layer of the circuit board and the second bonding layer are made of the same conductive material, and the second bonding layer is porous.

11. The stacked structure of claim 10, wherein the bump and the first bonding layer of the chip module, the circuit layer and the patterned seed layer of the circuit board, and the second bonding layer are bonded with each other to form an integral solid structure.

12. The stacked structure of claim 10, wherein the patterned seed layer of the circuit board and the second bonding layer are made of copper.

13. The stacked structure of claim 10, wherein the second bonding layer formed on the patterned seed layer is in contact with the chip body of the chip module.

14. The stacked structure of claim 6, wherein the sidewall of the opening is tapered upward.

15. The stacked structure of claim 6, wherein the sidewall of the opening is substantially perpendicular to a top surface of the first dielectric layer.

16. The stacked structure of claim 10, wherein a sidewall of the second bonding layer is coplanar with a sidewall of the patterned seed layer.

\* \* \* \* \*